US005239272A

United States Patent [19]

Bohlen et al.

[11] Patent Number: 5,239,272

[45] Date of Patent: Aug. 24, 1993

[54] ELECTRON BEAM TUBE ARRANGEMENTS HAVING PRIMARY AND SECONDARY OUTPUT CAVITIES

[75] Inventors: Heinz P. Bohlen; David M. Wilcox, both of Chelmsford; Roy Heppinstall, Witham; Mark Bridges, Chelmsford; Steven Bardell, Barnston, all of United Kingdom

[73] Assignee: EEV Limited, Chelmsford, United Kingdom

[21] Appl. No.: 664,567

[22] Filed: Mar. 6, 1991

[30] Foreign Application Priority Data

Mar. 9, 1990 [GB] United Kingdom ................. 9005381
Mar. 28, 1990 [GB] United Kingdom ................. 9006938

[51] Int. Cl.[5] ........................ H01J 28/18; H03H 3/60

[52] U.S. Cl. .......................................... 330/45; 315/5; 315/5.89; 333/230

[58] Field of Search ...................... 315/4.5, 5.39, 5.53; 333/230, 227; 330/44, 45

[56] References Cited

U.S. PATENT DOCUMENTS

| | | | |
|---|---|---|---|
| 2,281,717 | 5/1942 | Samuel | 315/5.51 X |
| 2,501,545 | 3/1950 | Sproull | 333/230 X |
| 2,511,120 | 6/1950 | Mueller | 330/45 X |
| 2,610,307 | 9/1952 | Hansen et al. | 315/5.53 |
| 2,966,635 | 12/1960 | Schachter | 333/230 X |
| 2,994,800 | 8/1961 | Lazzarini | 333/230 X |
| 3,484,861 | 12/1969 | Dehn | 330/44 X |
| 4,184,123 | 1/1980 | Grill et al. | 333/230 X |
| 4,206,428 | 6/1980 | Kaegebein | 333/230 X |
| 4,291,288 | 9/1981 | Young et al. | 333/230 X |
| 4,686,494 | 8/1987 | Kaneko et al. | 333/230 X |

FOREIGN PATENT DOCUMENTS

| | | |
|---|---|---|
| 8896 | 3/1980 | European Pat. Off. . |
| 575123 | 2/1946 | United Kingdom . |
| 639981 | 7/1950 | United Kingdom . |
| 650421 | 2/1951 | United Kingdom . |

OTHER PUBLICATIONS

Patent Abstracts of Japan, vol. 8, No. 213, (E-269) (1650), Sep. 28, 1984, JP-A-59 99646, Jun. 8, 1984.

*Primary Examiner*—Robert J. Pascal
*Assistant Examiner*—Benny T. Lee
*Attorney, Agent, or Firm*—Spencer, Frank & Schneider

[57] ABSTRACT

An electron beam tube arrangement has an output cavity resonator circuit which includes a first output cavity, a second output cavity being coupled thereto by means of a coupling loop. The coupling loop is located in the first cavity and connected to said second cavity. In one embodiment of the invention, the second cavity also contains a coupling loop which is electrically connected to that in the first output cavity.

15 Claims, 3 Drawing Sheets

ELECTRON BEAM TUBE ARRANGEMENTS HAVING PRIMARY AND SECONDARY OUTPUT CAVITIES

FIELD OF THE INVENTION

The present invention relates to electron beam tube arrangements and in particular to output resonator cavities of such arrangements from which high frequency energy is extracted.

BACKGROUND OF THE INVENTION

The present invention is particularly applicable to an inductive output tetrode (IOT) device such as a KLYSTRODE (Registered Trade Mark, Varian Associates Inc). The advantages of inductive output tetrode devices (hereinafter referred to as "IOT's") are well known but previously proposed designs have suffered from problems in that it has been necessary to provide a number of tubes, each of which may require to be used with a number of different cavities in order to provide the instantaneous bandwidth required (e.g. 8 MHz) over the entire television frequency range (e.g. 470–860 MHz). In klystrons, this requirement has been met by stagger tuning of the various cavities along the electron beam path to give outputs at different frequencies which add to give the required bandwidth. However, this is not possible with conventional IOT design.

It has been previously proposed to provide coupled output cavities for IOTs in which coupling is achieved between the two cavities by means of an adjustable aperture in a common wall. Variations in the coupling are limited to those that can be obtained by varying the size of the aperture.

SUMMARY OF THE INVENTION

It is an object of the present invention to provide a coupling system in which such limitations are mitigated.

In accordance with the present invention, there is provided an electron beam tube arrangement including an output cavity resonator circuit comprising a primary output cavity having a secondary output cavity coupled thereto by means of a loop projecting into said primary cavity and being connected to couple energy from said primary cavity into said secondary cavity.

It is preferred that the position and/or orientation of the loop in the primary cavity be adjustable so as to affect the degree of coupling between the cavities. Thus the loop may be rotatable and in addition it could also be capable of being moved further into the cavity, for example. The size of the loop can be selected to provide the coupling characteristics required.

It is preferred that a second loop is located in the secondary cavity and is connected to the first loop in the cavity. The two loops may be independently adjustable to provide optimum coupling between the two cavities.

In another embodiment of the invention, the loop located within the primary cavity is connected to a dome formation in a wall of the secondary cavity.

In a further embodiment of the invention, a conductive body is included within the secondary cavity and spaced from a conductive portion therein so as to define a gap therebetween, the conductive body being connected to the loop.

The conductive portion is typically a further conductive body which may be attached to a wall of the cavity.

Alternatively, the conductive portion can comprise a portion of the wall of the cavity itself.

The loop in the primary cavity and the conductive body are preferably linked on a conductive movable shaft such that the orientation of the loop can be adjusted by rotation of the shaft.

It is preferred that one or both cavities include means for adjusting the volume thereof in order to vary the resonant frequency of the respective cavities. Preferably the cavities have respective different resonant frequencies.

Although the invention arose from considering improvements in the performance of IOTs, it is envisaged that it may also be applicable to other types of electron beam tube arrangements employing output resonant cavities, such as klystrons for example.

BRIEF DESCRIPTION OF THE DRAWINGS

Some ways in which the invention may be performed are now described by way of example with reference to the accompanying drawings in which.

DESCRIPTION OF PREFERRED EMBODIMENT

Figure 1:
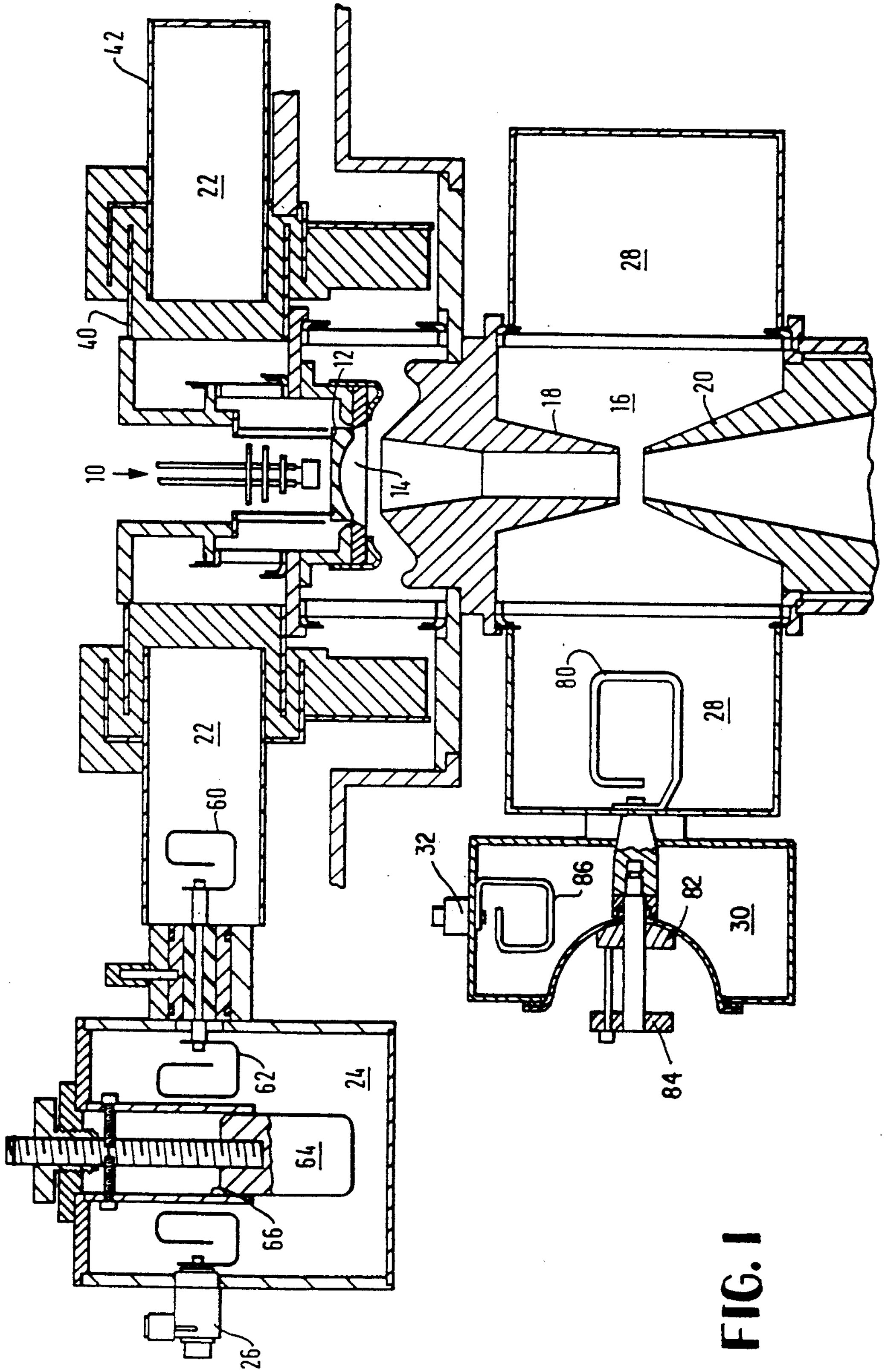
FIG. 1 is a diagrammatic cross-section side view of an IOT in accordance with the present invention (parts have been omitted for clarity)

With reference to FIG. 1, an IOT comprises an electron gun 10 incorporating a cathode 12 and grid 14, and an output section 16 incorporating drift tubes 18, 20. The input assembly including the electron gun 10, cathode 12 and grid 14 is surrounded by a primary cavity 22 which is coupled to a secondary input cavity 24 having an input coupling 26. The output section 16 is surrounded by a primary output cavity 28 which is coupled to a secondary output cavity 30 having an output coupling 32.

In use, an r.f. voltage on the order of several hundred volts is produced between the cathode and grid while both are maintained at about 30 kV. It is also necessary that the grid 14 should be maintained at a nominal d.c. bias voltage on the order of minus one hundred volts with respect to the cathode.

The present invention particularly relates to the output resonator circuits surrounding the output section 16. In this embodiment, a primary output cavity 28 is provided around the output section 16 in the usual manner and includes movable tuner means (not shown) for varying the volume of the cavity 28 so as to adjust the resonant frequency thereof. A secondary output cavity 30 is provided adjacent to the primary cavity 28 and coupled thereto by means of a movable coupling loop 80 which is positioned within the cavity 28. A domed formation 82 is provided in a wall of the secondary cavity 30 projecting into the interior thereof, the loop 80 being connected to this formation. An adjusting knob 84 is provided outside the secondary cavity 30 and is operatively connected to the loop 80 so as to allow adjustment of the orientation thereof. Further means can be provided for adjusting the penetration of the loop into the primary cavity. The adjustment of the loop 80 affects the degree of coupling between the two cavities 28, 30. The output from the secondary cavity 30 is taken via a further loop 86 connected to an output coupling 32. Resonance tuning of the secondary cavity is achieved in a conventional manner.

The use of one or more loops in the resonance circuit allows efficient and controllable coupling, the dome formation 82 allowing smooth and efficient transition between the resonances of the cavities at the power levels created in an IOT.

At the input end of the IOT shown in the drawing, a primary input cavity 22 is defined by internal and external body portions 40, 42 which are insulated from each other. The volume of the cavity 22 is variable in the conventional manner. The cavity 22 is coupled via loops 60, 62 to a secondary input cavity 24, the volume of which is variable by adjustment of a plunger 64 projecting from a bore member 66.

Figure 2:
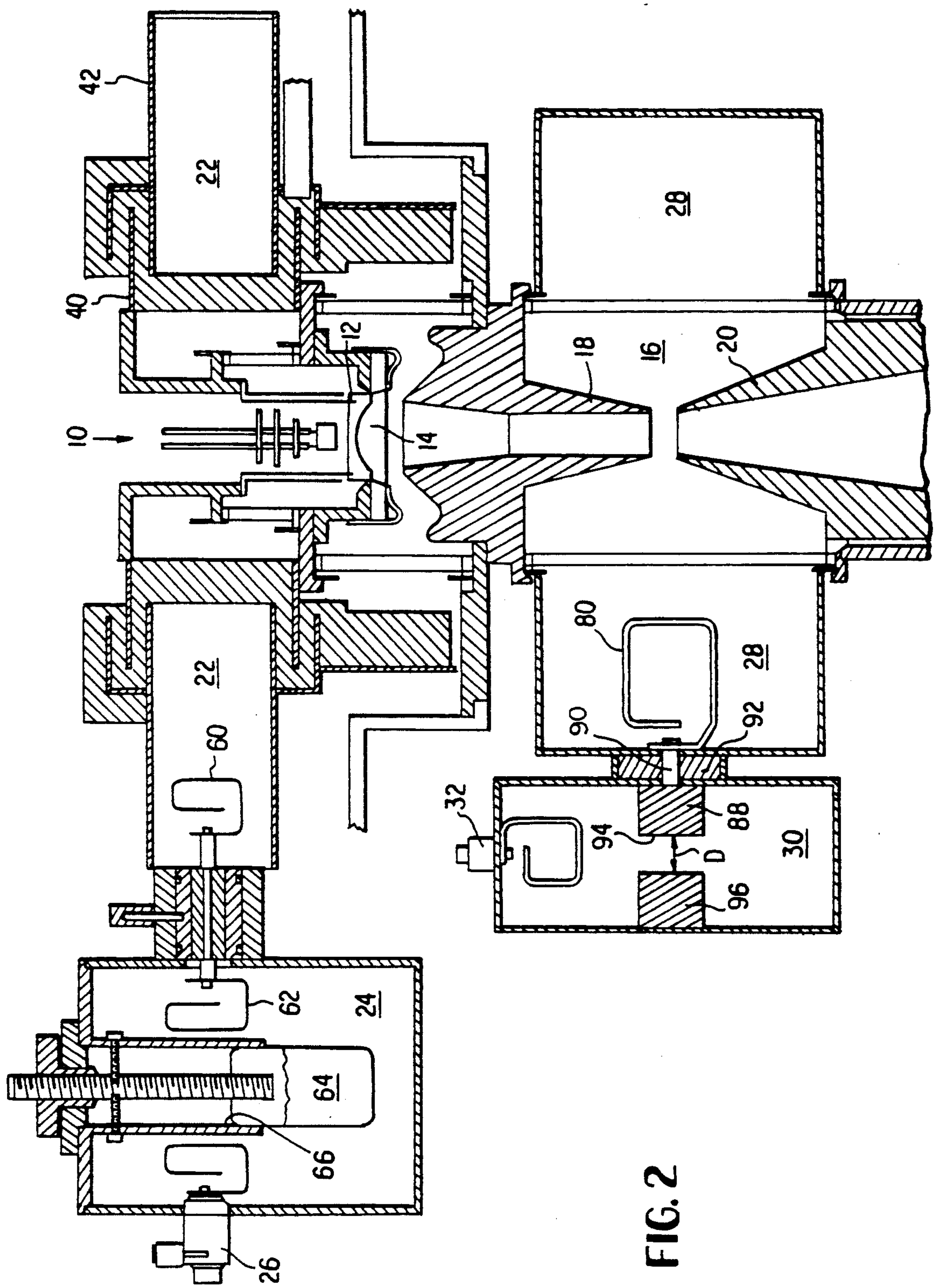
FIG. 2 schematically illustrates another IOT in accordance with the invention.

With reference to FIG. 2, another IOT in accordance with the invention is similar to that shown in FIG. 1 and like parts are given like reference numerals.

As in the arrangement of FIG. 1, the IOT has two output cavities 28 and 30. A movable coupling loop 80 in the primary cavity 28 is connected to a first conductive body 88 within the secondary cavity by means of a conductive shaft 90. The walls of the cavities 28, 30 are separated by a dielectric bushing 92 through which the shaft 90 passes. Means are provided (not shown) for rotating the bushing 92 and shaft 90 so as to adjust the orientation of the loop 80 in the cavity 28. The first conductive body 88 is also caused to move but as the axial surface 94 of the body is flat, there is no effect on its behaviour. A further conductive body 96 is fixed to the wall of the cavity 30 opposite the first conductive body 88 so as to define a gap D. The size of this gap D is selected to give the optimum tuning effect and is substantially constant. In certain circumstances, it may be appropriate to provide an insulating material between the bodies 88, 96 to define the gap D. The second conductive body 96 could be dome shaped or might be provided by a formation in the wall of the cavity 30 as a tubular body depending upon requirements. A further coupling loop 32 is provided in the cavity 30 to allow power to be output therefrom.

If insulating material is included between the bodies 88, 96 it can be used to provide a mechanical connection and the second body 96 can be connected to an adjusting knob for rotation of the loop 80 instead of the mechanism shown in FIG. 2.

The use of the loop and conductive bodies in the resonance circuit allows efficient and controllable coupling to be achieved and provides a smooth and effective transition between the resonances of the cavities at the power levels created in an IOT.

Figure 3:
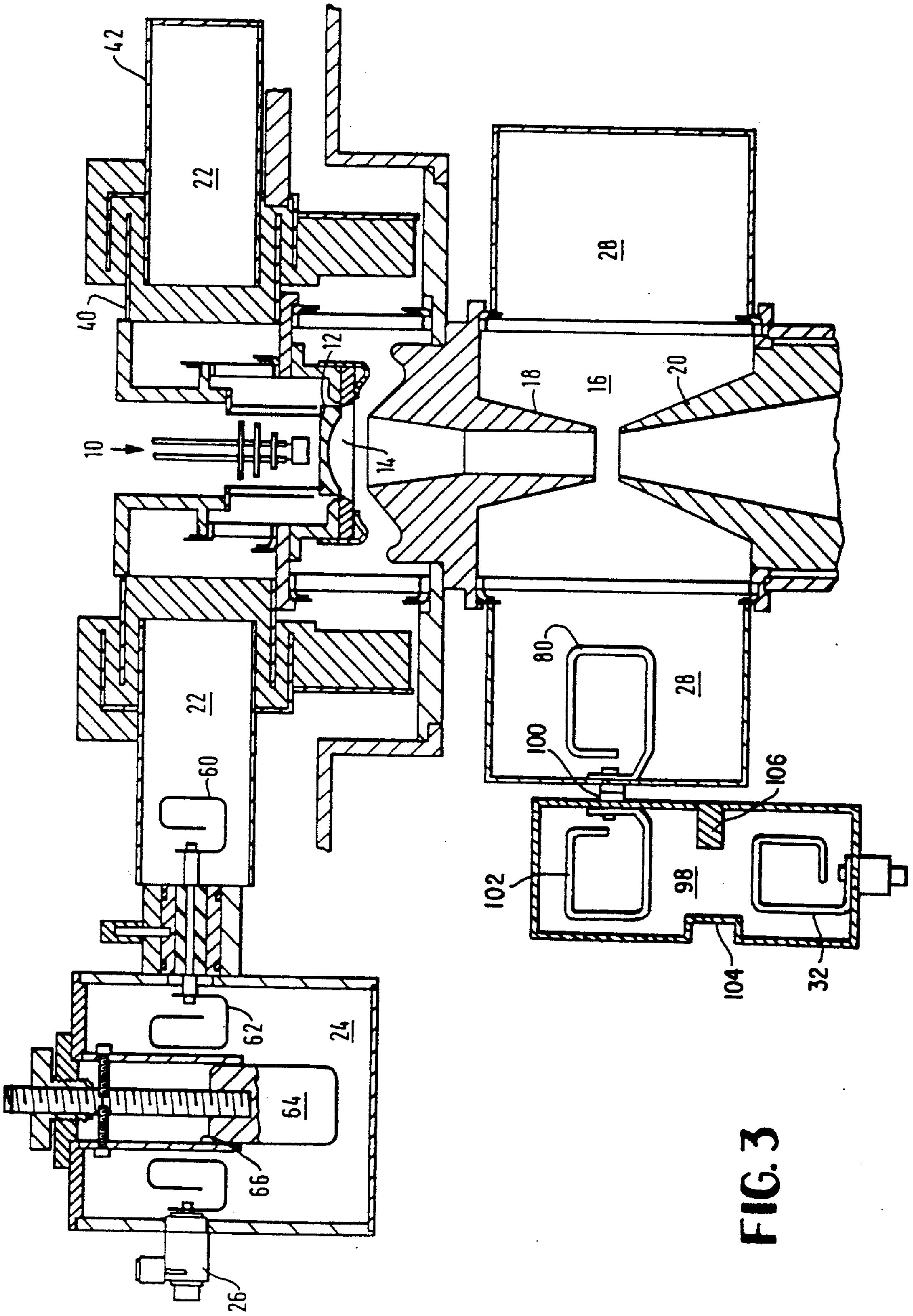
FIG. 3 is a schematic representation of a further IOT in accordance with the invention.

With reference to FIG. 3, another IOT in accordance with the invention has an output arrangement which includes a primary cavity 28 and a secondary cavity 98. A coupling loop 80 in the primary cavity 28 is electrically connected via a shaft 100 having a rotating joint to another coupling loop 102 located in the secondary cavity 98. The loops 80 and 102 are independently rotatable, their orientations being controlled by levers (not shown) attached to the relatively rotatable parts of the shaft 100.

Another loop 32 located in the secondary cavity 98 enables the amplified r.f. energy to be extracted from the IOT.

The walls of the secondary cavity 98 include projections 104 and 106 extending into its interior. In this embodiment, one of the projections 104 is fixed in location and configuration. The other projection 106 is adjustable and is movable in or out of the cavity 98 by a variable amount as desired. Of course, an arrangement may be used in which both projections are fixed, both are adjustable or they could be omitted altogether. The use of the projections 104, 106 enables the resonance characteristics of the cavity 98 to be optimised.

Both the primary and secondary cavities 28 and 98 include movable tuners or "tuning doors" (not shown) to enable their volumes, and hence resonant frequencies, to be varied. The cavities 28, 98 are tuned to respective different resonant frequencies to give a large output bandwidth.

We claim:

1. A linear electron beam tube amplifying arrangement, comprising:

a primary output cavity;

amplification means, responsive to a high frequency input signal, for producing an amplified output signal in said primary output cavity, said amplification means including an input cavity, means for applying said high frequency input signal to said input cavity, and means for generating an electron beam, said electron beam being modulated by said input signal and interacting with said primary output cavity to produce said amplified output signal in said primary output cavity;

a secondary output cavity;

first coupling means for coupling said amplified output signal from said primary output cavity to said secondary output cavity, said first coupling means including a coupling loop located in said primary output cavity; and second coupling means for coupling said amplified output signal out of said secondary output cavity, wherein said first coupling means further comprises a conductive body positioned within said secondary output cavity and spaced from a conductive portion therein so as to define a gap therebetween, and wherein said first coupling means further comprises a conductive rotatable shaft which links said conductive body to said coupling loop in such a manner that the orientation of said coupling loop in said first output cavity is adjustable by rotation of said shaft.

2. An arrangement as claimed in claim 1, wherein said secondary output cavity comprises a wall, and wherein said conductive portion comprises a second conductive body which is attached to said wall.

3. An arrangement as claimed in claim 1, wherein said secondary output cavity comprises a wall, and wherein said conductive portion comprises a portion of said wall.

4. An arrangement as claimed in claim 1, wherein said secondary output cavity comprises a wall, wherein said conductive portion comprises another conductive body which is attached to said wall, wherein said conductive body and said another conductive body are both rotatable, and further comprising an insulating portion connecting said conductive body and said another conductive body so as to allow movement of said shaft and said coupling loop by rotation of said second conductive body.

5. A linear electron beam tube amplifying arrangement, comprising:

a primary output cavity;

amplification means, responsive to a high frequency input signal, for producing an amplified output signal in said primary output cavity, said amplification means including an input cavity, means for applying said high frequency input signal to said input cavity, and means for generating an electron beam, said electron beam being modulated by said input signal and interacting with said primary output cavity to produce said amplified output signal in said primary output cavity;

a secondary output cavity;

first coupling means for coupling said amplified output signal from said primary output cavity to said secondary output cavity, said first coupling means including a coupling loop located in said primary output cavity; and second coupling means for coupling said amplified output signal out of said secondary output cavity, wherein said first coupling means further comprises another coupling loop located in said secondary output cavity, said another coupling loop being connected to said coupling loop located in said primary output cavity, and wherein at least one of the position of said another coupling loop in said secondary output cavity and the orientation of said another coupling loop in said secondary output cavity is adjustable.

6. A linear electron beam tube amplifying arrangement, comprising:

a primary output cavity;

amplification means, responsive to a high frequency input signal, for producing an amplified output signal in said primary output cavity, said amplification means including an input cavity, means for applying said high frequency input signal to said input cavity, and means for generating an electron beam, said electron beam being modulated by said input signal and interacting with said primary output cavity to produce said amplified output signal in said primary output cavity;

a secondary output cavity;

first coupling means for coupling said amplified output signal from said primary output cavity to said secondary output cavity, said first coupling means including a coupling loop located in said primary output cavity; and second coupling means for coupling said amplified output signal out of said secondary output cavity, wherein said first coupling means further comprises another coupling loop located in said secondary output cavity, said another coupling loop being connected to said coupling loop located in said primary output cavity, and wherein at least one of the position and orientation of said coupling loop located in said primary output cavity is adjustable independently of said another coupling loop.

7. An arrangement as claimed in claim 6, wherein said secondary output cavity comprises a wall which extends in a direction parallel to an electron beam path of said electron beam, said wall having a centre, and wherein said first coupling means further comprises a member which extends through said wall and which connects said another coupling loop to said coupling loop located in said primary output cavity, said member being offset from said centre of said wall.

8. A linear electron beam amplifying arrangement, comprising:

a primary output cavity;

amplification means, responsive to a high frequency input signal, for producing an amplified output signal in said primary output cavity, said amplification means including an input cavity, means for applying said high frequency input signal to said input cavity, and means for generating an electron beam, said electron beam being modulated by said input signal and interacting with said primary output cavity to produce said amplified output signal in said primary output cavity;

a secondary output cavity, said secondary output cavity including a wall;

first coupling means for coupling said amplified output signal from said primary output cavity to said secondary output cavity, said first coupling means including a coupling loop located in said primary output cavity;

second coupling means for coupling said amplified output signal out of said secondary output cavity; and at least one projection which extends from said wall into said secondary output cavity and which is movably disposed in said secondary output cavity.

9. A linear electron beam tube amplifying arrangement, comprising:

a primary output cavity;

amplification means, responsive to a high frequency input signal, for producing an amplified output signal in said primary output cavity, said amplification means including an input cavity, means for applying said high frequency input signal to said input cavity, and means for generating an electron beam, said electron beam being modulated by said input signal and interacting with said primary output cavity to produce said amplified output signal in said primary output cavity;

a secondary output cavity;

first coupling means for coupling said amplified output signal from said primary output cavity to said secondary output cavity, said first coupling means including a coupling loop located in said primary output cavity; and second coupling means for coupling said amplified output signal out of said secondary output cavity;

wherein said secondary output cavity comprises a wall with a dome formation, and wherein said first coupling means further comprises means for connecting said coupling loop to said dome formation.

10. A linear electron beam tube amplifying arrangement, comprising:

a primary output cavity;

amplification means, responsive to a high frequency input signal, for producing an amplified output signal in said primary output cavity, said amplification means including an input cavity, means for applying said high frequency input signal to said input cavity, and means for generating an electron beam, said electron beam being modulated by said input signal and interacting with said primary output cavity to produce said amplified output signal in said primary output cavity;

a secondary output cavity;

first coupling means for coupling said amplified output signal from said primary output cavity to said secondary output cavity, said first coupling means including a coupling loop located in said primary output cavity; and second coupling means for coupling said amplified output signal out of said secondary output cavity, wherein said first coupling means comprises means for permitting a variable degree of coupling between said primary and secondary output cavities, at least one of the position of said coupling loop in said primary output cavity and the orientation of said coupling loop in said primary output cavity being adjustable so as to adjust the degree of coupling between said primary and secondary output cavities.

11. An arrangement as claimed in claim 10, wherein the electron beam tube is an inductive output tetrode device.

12. An arrangement as claimed in claim 10, wherein said primary and secondary output cavities have respective different resonance frequencies.

13. An arrangement as claimed in claim 10, wherein each of said first and second output cavities define a respective volume therein, and further comprising means for adjusting the volumes of said first and second output cavities.

14. An arrangement as claimed in claim 10, wherein said second coupling means comprises an output loop for extracting said amplified output signal from said secondary output cavity.

15. An arrangement as claimed in claim 10, wherein said secondary output cavity comprises a wall, said wall having at least one projection which extends inwardly into said secondary output cavity.

* * * * *